(12) United States Patent
Takahashi et al.

(10) Patent No.: US 7,684,839 B2
(45) Date of Patent: Mar. 23, 2010

(54) CONNECTING STRUCTURE FOR MAGNESIUM DIBORIDE SUPERCONDUCTING WIRE AND A METHOD OF CONNECTING THE SAME

(75) Inventors: Masaya Takahashi, Hitachinaka (JP); Yoshimichi Numata, Mito (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 1130 days.

(21) Appl. No.: 11/299,670

(22) Filed: Dec. 13, 2005

(65) Prior Publication Data

US 2006/0240991 A1 Oct. 26, 2006

(30) Foreign Application Priority Data

Dec. 14, 2004 (JP) .............................. 2004-360668

(51) Int. Cl.
*H01B 12/00* (2006.01)
*H01L 39/24* (2006.01)
(52) U.S. Cl. ..................... 505/220; 505/231; 505/234; 505/430; 174/125.1; 29/599

(58) Field of Classification Search ................. 505/220, 505/231, 234, 430; 174/125.1; 29/599
See application file for complete search history.

(56) References Cited

U.S. PATENT DOCUMENTS

| 4,907,338 | A * | 3/1990 | Thornton | ..................... 29/599 |
| 7,018,954 | B2 * | 3/2006 | Thieme et al. | ............. 505/430 |
| 2003/0051901 | A1 * | 3/2003 | Morita et al. | ............ 174/125.1 |

FOREIGN PATENT DOCUMENTS

| JP | 2002-358972 | 12/2002 |
| JP | 2003-37303 | 2/2003 |

* cited by examiner

*Primary Examiner*—Stanley Silverman
*Assistant Examiner*—Kallambella Vijayakumar
(74) *Attorney, Agent, or Firm*—Antonelli, Terry, Stout & Kraus, LLP.

(57) ABSTRACT

A magnesium diboride superconducting wire has excellent conduction property and stability. The superconductive connection of the magnesium diboride superconducting wire covered with a superconducting coating layer and a same or different kind of another superconducting wire are connected in a metal tube filled with a solder by way of the superconductive coating layer.

20 Claims, 12 Drawing Sheets

CONNECTING STRUCTURE FOR MAGNESIUM DIBORIDE SUPERCONDUCTING WIRE AND A METHOD OF CONNECTING THE SAME

CLAIM OF PRIORITY

This application claims priority from Japanese application serial No. 2004-360668, filed on Dec. 14, 2004, the content of which is hereby incorporated by reference into this application.

FIELD OF THE INVENTION

The present invention concerns a connecting structure for a magnesium diboride (hereinafter referred to as $MgB_2$) superconducting wire having a high superconductive critical current density under a circumstance of a critical temperature or lower, and to a method of connecting the superconducting wires.

BACKGROUND OF THE INVENTION

The critical temperature of an $MgB_2$ wire is 39K, which is higher by at least about 20K than that of usual metal type superconductive materials. Further, the upper critical magnetic field is also high and a thin film $MgB_2$ has about 40 T. Further, since the magnetic anisotropy is extremely small and since it is excellent in bending property, it has little difference from usual metal type superconductive materials in the manufacture and handling of the wire materials. While various studies are being made at present for making $MgB_2$ wire materials, it is considered that application of the superconducting wires under cooling by refrigerators with a smaller cooling capacity than that of a cryostat for cooling the conventional metal superconducting wires or in the intense magnetic field will become practical by utilizing the features. Among the application uses, products that require permanent current operation need superconductive connection.

Japanese Patent Laid-Open No. 2002-358972 (Patent Document 1) discloses a method of connecting a superconducting wire material formed by adding at least one of Y, Sn, Pb, Fe, and Al to $MgB_2$, and a connecting portion wherein $MgB_2$ powder is coated on the connecting portion and the wire and the connecting portion are bonded under pressure, and Japanese Patent Laid-Open No. 2003-037303 (Patent Document 2) discloses a method of connection the MgB2 superconducting wire and NbTi superconducting wire are bonded by bringing the superconductive cores into contact with each other upon removing a stabilizing material and coating a solder therebetween.

Generally, an $MgB_2$ wire is manufactured by a powder-in tube method by filling $MgB_2$ or Mg and B in a metal sheath tube such as made of Fe, SUS, Cu, Ni or a metal sheath tube formed of composite metals thereof, followed by fabricating and optionally a heat treatment.

In connecting the superconducting wires of $MgB_2$, a method of directly connecting the $MgB_2$ wire wherein the metal sheath tube at the connection portion is removed to expose the superconductive portion of $MgB_2$ and the exposed portion is connected is disclosed in the Patent Document 2. However, the present inventors have found that this method and the method in Patent Document 1 are not suitable for the manufacture of the superconductive connection portion having excellent current conducting property and stability.

That is, when the metal sheath tube as a stabilizing material for the connection portion of the $MgB_2$ wire is removed to expose $MgB_2$, the denseness of the $MgB_2$ wire, which is formed densely by the metal sheath tube, is lost and the superconductivity for the portion is remarkably deteriorated, thereby to form a connection portion that lacks the current conduction property and the stability.

The present invention aims at providing a connection structure of a magnesium diboride superconducting wire having excellent current conduction property and stability, wherein the superconductive connection between a magnesium diboride superconducting wire and a same or different kind of a superconducting wire are connected a method of connecting them.

SUMMARY OF THE INVENTION

The present invention provides a connection structure of a magnesium diboride superconducting wire in which a magnesium diboride superconducting wire covered with a superconductive coating layer and another superconducting wire are connected in a connecting metal tube filled with a solder wherein they are in contact with each other It is preferable that the superconductive coating layer covering the $MgB_2$ superconducting wire is Nb, an alloy whose main ingredient is Nb, an Nb—Ti alloy or an Nb—Ta alloy, the another superconducting wire is a superconducting wire of $MgB_2$, NbTi, $Nb_3Sn$ or $Nb_3Al$, and the superconductive coating layer is mad of a highly electroconductive metal layer other than the material of the connection portion.

It is preferable that the highly conductive metal layer is Cu, Al, Ag, Au, Pt or alloys thereof or a Cu—Ni alloy. At least the contact portion of the highly conductive metal layer with the another superconducting wire or the entire portion is dipped in a molten solder containing Sn, Mg, In, Ga, Pb, Te, Tl, Zn, Bi or Al. The solder is a solder for superconducting wires, which comprises 30 to 70% of Pb and 30 to 70% of Bi on the weight basis.

It is preferable that the MgB2 superconductor wire comprises a plurality of the magnesium diboride superconducting wires and, a high strength metal wire in the axial direction in a central portion of the magnesium diboride superconducting wires. The high strength metal wire is at least one of Ta, Fe, Nb and combinations thereof.

The invention also provides a method of connecting a magnesium diboride superconducting wire with another superconducting wire wherein the magnesium diboride superconducting wire covered with a superconductive coating layer and a highly conductive metal layer disposed on the layer and the another superconductive layer are inserted into a connection metal tube, which is filled with a solder thereby connecting magnesium diboride and the superconducting wire. The highly conductive metal layer at the portion to be connected is dissolved and removed by a molten metal to expose the superconductive coating layer and connecting them while bringing the exposed portion and the another superconductive layer into contact with each other.

It is preferable to form a fixed portion by winding and fixing the magnesium diboride superconducting wire at a portion having the exposed superconductive coating layer and other superconducting wire described above by a superconducting wire material, insert the fixed portion in the connection metal tube, and fill the solder in the connection metal tube.

The invention can provides a connection structure for a magnesium diboride superconducting wire having excellent current conduction property and stability by superconductive connection between the magnesium diboride superconducting wire and an identical or different kind of a superconducting wire, as well as a connection method thereof.

DETAILED DESCRIPTION OF THE PREFERRED EMBODIMENTS

Preferred embodiments of the invention are to be described with reference to specific comparative examples and examples.

COMPARATIVE EXAMPLE 1

Figure 1:
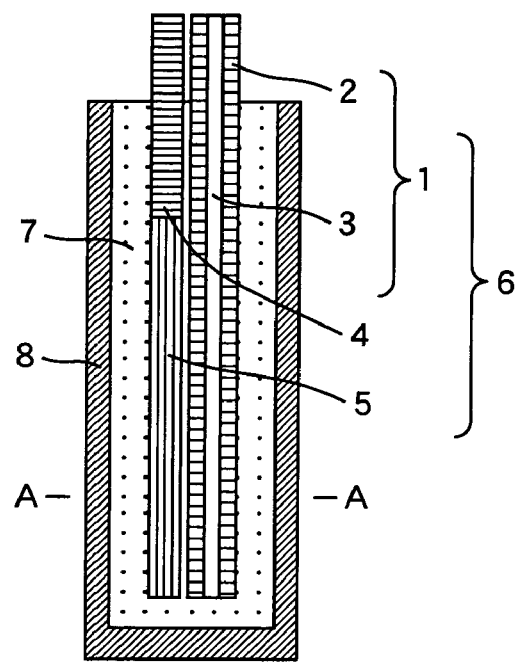
FIG. 1 is a cross sectional view showing a superconductive connection structure of a comparative example for directly connecting $MgB_2$ wires
Figure 2:
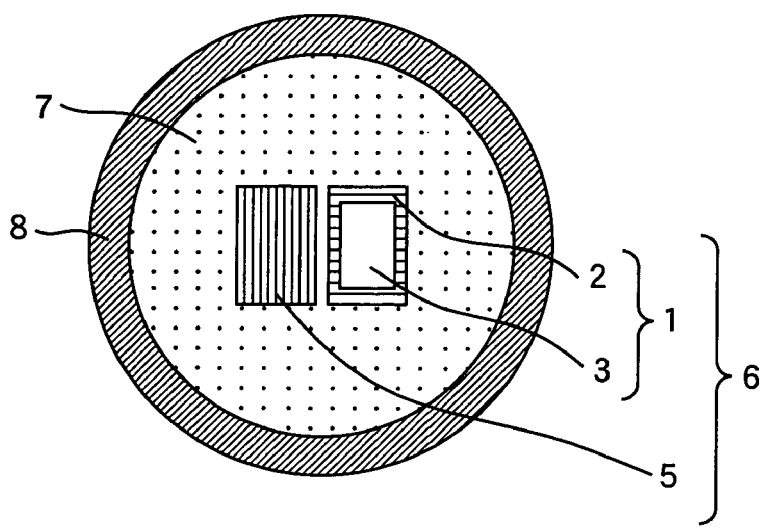
FIG. 2 is a cross sectional view along line A-A in FIG. 1.
Figure 3:
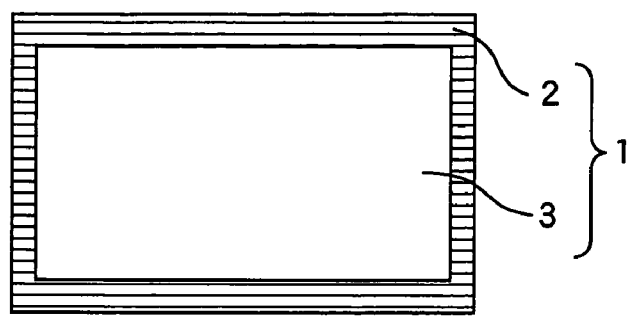
FIG. 3 is a cross sectional view for the $MgB_2$ wire 3 shown in FIG. 1.

FIG. 1 is a cross sectional view for superconductive connection of directly connecting an $MgB_2$ wire and FIG. 2 is a cross sectional view along line A-A in FIG. 1. FIG. 3 is a cross sectional view of an $MgB_2$ wire. In this comparative example, an NbTi wire is used as a superconducting wire to be superconductively connected with the $MgB_2$ wire. It has a structure in which a $MgB_2$ wire 1 has a metal sheath 2 and an $MgB_2$ superconductive portion 3, a wire fixed portion 6 is formed by fixing a superconductive portion 5 of other superconducting wire 4 and the $MgB_2$ wire 1, and they are inserted in a connection metal tube 8 filled with a solder 7. In this connection structure, the $MgB_2$ superconductive portion 3 is connected by way of a metal sheath 2 to the solder 7 and other superconductive portion 5.

A sample for superconductive connection having the connection structure was manufactured and measurement for critical current was conducted. Measurement was conducted by dipping the entire specimen into liquid helium by using a usual DC current 4-terminal method. In a case of the sample of superconductive connection in this example, generation of resistance was not observed in current conduction up to 15 A. Since the current conduction property of the $MgB_2$ wire and the NbTi wire have higher level, it has been found that the current conducted to the superconductive connection portion was extremely low.

This is considered to be attributable to that while the $MgB_2$ superconductive portion is a superconductor, the metal sheath 2 at the outside thereof is a normal conductor. Accordingly, in a case of connecting the whole $MgB_2$ wire, the connection length is extremely increased in order to provide a necessary conduction property for the connection portion. Further, since the connection structure includes the ordinary conductor, the connection resistance in the superconductive connection portion is increased and, in a case of manufacturing superconductive coils having necessary stability, since the inductance has to be made larger, it is necessary to manufacture superconductive coils of an extremely large size.

On the other hand, in recent years, the conduction property or the stability required for the superconductive connection portion has tended to be increased. From the foregoings, since the method of connecting the whole $MgB_2$ wire increases the loss extremely, this may be considered to be a connection structure not suitable to the manufacture of a superconductive connection portion having excellent conduction property and magnetic field stability. That is, it is considered necessary that the superconductive connection portion of the $MgB_2$ wire be formed with a substance showing superconductivity in the working circumstance thereof.

COMPARATIVE EXAMPLE 2

Figure 4:
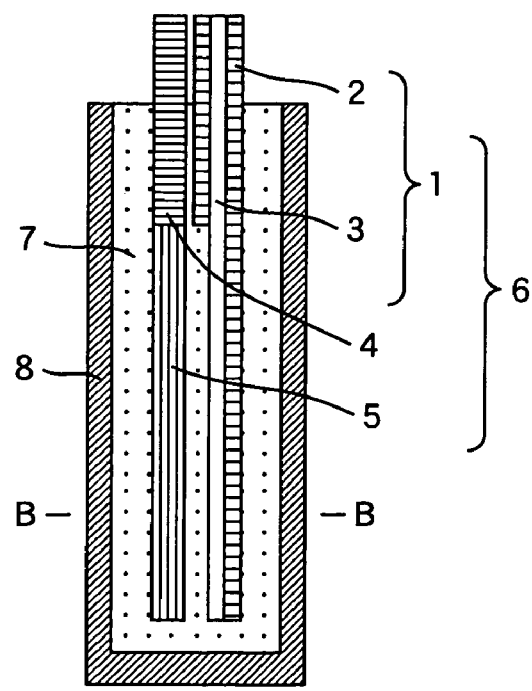
FIG. 4 is a cross sectional view showing a superconductive connection structure of another comparative example wherein the $MgB_2$ superconductive portion for connection is exposed.
Figure 5:
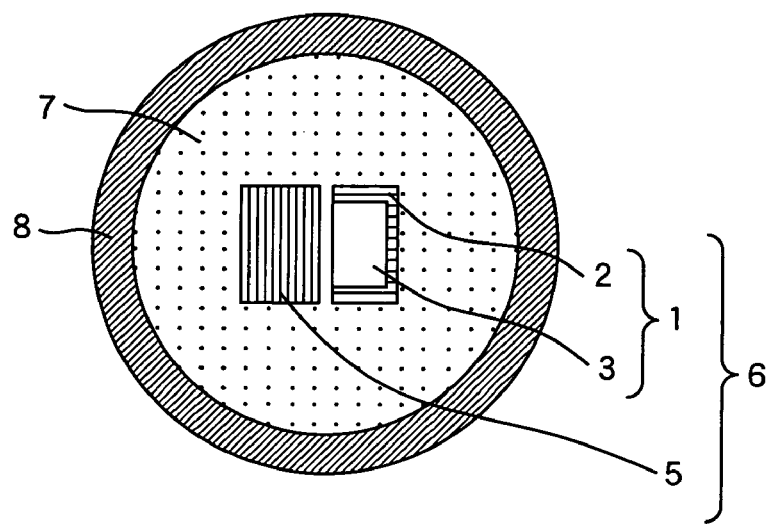
FIG. 5 is a cross sectional view along line B-B in FIG. 4.

FIG. 4 is a cross sectional view showing a superconductive connection structure for exposing the superconductive portion of MgB$_2$ for connection and FIG. 5 is a cross sectional view along line B-B in FIG. 4. An MgB$_2$ wire 1 of a cross sectional structure shown in FIG. 3 is used. The MgB$_2$ wire 1 has a metal sheath 2 and an MgB$_2$ superconductive portion 3, a superconductive portion 5 of other superconducting wire 4 and the MgB$_2$ superconducting portion 3 are fixed to form a wire material fixed portion 6, which are inserted into a connection metal tube 8 filled with a solder 7. This is different from Example 1 in that the MgB$_2$ superconductive portion 3 as the superconductive portion for the MgB$_2$ wire 1 is exposed, and the exposed superconductive portions are connected to each other. The structure is a general superconductive connection.

(Trial Manufacture 2-1)

The MgB$_2$ wire 1 in which the metal sheath 2 was made of Fe, SUS or Ni was superconductively connected. For exposing the MgB$_2$ superconductive portion 3 of the MgB$_2$ wire, it was dipped in an acidic solution and dissolved, or the metal sheath 2 was mechanically polished on one side. The superconductive connection sample was manufactured and a critical current was measured. Measurement was conducted in the same manner as in Comparative Example 1 by dipping the entire specimen in liquid helium in the same manner as in Comparative Example 1 by using a usual DC current four terminal method. In a case of the superconductive connection sample, electric conduction was not conducted and the connection portion was not made superconductive. Since the MgB$_2$ wire 1 and the NbTi wire 4 were made superconductive as the conduction property, it was found that the superconductive connection portion was not superconductive.

This is considered to be attributable to that the MgB$_2$ superconductive portion 3 was oxidized remarkably upon removal of the metal sheath 2 to form a thick oxide film layer relative to the superconductive portion of other superconducting wire upon connection. That is, in this connection method, the MgB$_2$ superconductive portion is connected by way of the oxide film layer as a normal conductor with the solder and other superconductive portion. It is also considered that the acidic solution invaded to the MgB$_2$ superconductive portion formed of a powder to destroy the same by dipping the MgB$_2$ wire into the acidic solution and, accordingly, this remarkably lowered the superconduction property of the MgB$_2$ wire per se.

(Trial Manufacture 2-2)

Then, the MgB$_2$ wire 1 in which the metal sheath 2 was made of Cu and Al was superconductively connected. In order to expose the MgB$_2$ superconductive portion of the MgB$_2$ wire 1, the MgB$_2$ superconductive wire with the superconductive coating and the high conductive coating on the superconductive coating was dipped into the molten metal. In the manufacturing method, the MgB$_2$ superconductive portion could be exposed without oxidation. The superconductive connection sample was manufactured by the manufacturing method and the critical current measurement was conducted. Measurement was conducted in the same manner as described above by dipping the entire specimen into liquid helium. In a case of the superconductive connection sample of trial manufacture 2-2, generation of resistance was not observed in conduction of current up to 6A. Since the MgB$_2$ wire 1 and the NbTi wire 4 have higher conduction property, it has been found that the current conducted to the superconductive connection portion was extremely low.

It is considered that this attributable to that the molten metal invaded into and destroy the MgB$_2$ superconductive portion 3 in the same manner as the acidic solution in the trial manufacture 2-1 and this remarkably lowered the superconduction property of the MgB$_2$ wire 1 per se.

The process for manufacturing the MgB$_2$ wire is to be discussed. Since the MgB$_2$ wire was manufactured by the powder-in-tube method, by incorporating MgB$_2$, Mg, and B in the metal sheath tube such as made of Fe, SUS, Cu, Ni, etc. or a metal sheath tube formed by compositing the metals, applying fabrication and, optionally, heat treatment. For improving the conduction properties of the metal sheath tubes, an increase is the working degree, addition of a third element, optimization for heat treatment conditions and optimization for powder, etc. are practiced.

It is considered that the MgB$_2$ wire 1 can be formed as a superconducting wire because MgB$_2$ can be filled in the metal sheath at high density and high purity by a high internal stress by way of various wire drawing fabrication. Accordingly, since exposure of them releases the internal stress, lowers the density and degraded the purity, it is considered that the superconduction property of the MgB$_2$ wire is remarkably lowered. That is, while the manufacturing method of exposing the MgB$_2$ superconductive portion 3 is different depending on the kind of the metal sheath and the state of the MgB$_2$ superconductive portion 3 is different depending on the manufacturing method, it is rather considered that exposure of the MgB$_2$ superconductive portion 3 is a greatest factor of deteriorating the conduction property of the superconductive connection portion.

In view of the above, the method of exposing the MgB$_2$ superconductive portion 3 for connection may be considered to be a connection method not suitable to the manufacture of the superconductive connection portion having excellent conduction property and magnetic field stability. That is, it is considered necessary for the superconductive connection of the MgB$_2$ wire 1 that the MgB$_2$ superconductive portion 3 is not exposed and no oxide layer is formed upon exposure.

From the result of the trial manufacture 2-1 and 2-2, it has been found that the following three points are essential conditions for the superconductive connection of the MgB$_2$ wire.

I. The superconductor is connected by a superconductor (not by way of normally conductive layer)
II. The superconductive portion is exposed without oxidation (preventing formation of oxide layer)
III. The MgB$_2$ superconductive portion is not exposed.

Particularly, I and II are important also for the superconductive connection of the NbTi wire or Nb$_3$Sn wire but the factor III is an item necessary only for the MgB$_2$ wire manufactured by the powder in tube method. That is, it can be seen for the superconductive connection of the MgB$_2$ wire that not only the superconductive connective portion should be made into an optimal structure but it is also necessary for an optimal structure including the structure of the MgB$_2$ wire. Based on the result described above, the present invention is to be described below.

EXAMPLE 1

Figure 6:
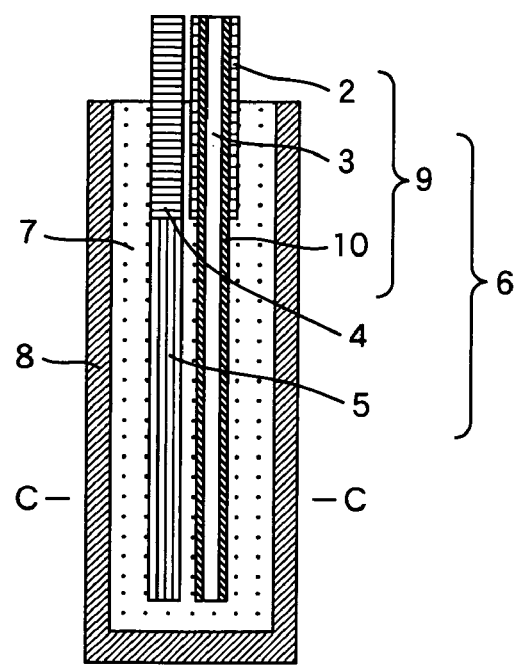
FIG. 6 is a cross sectional view showing a superconductive connection structure between an $MgB_2$ superconducting wire material and another superconducting wire material according to the invention.
Figure 7:
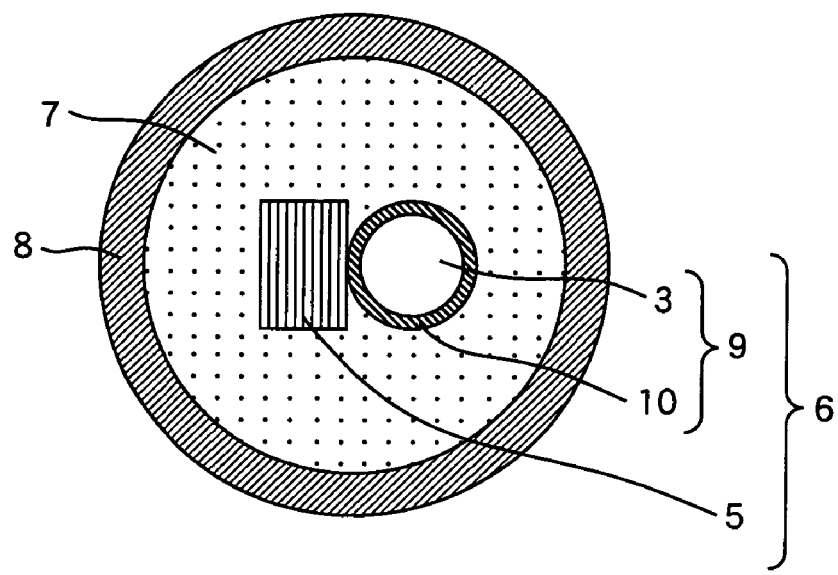
FIG. 7 is a cross sectional view along line C-C in FIG. 6.
Figure 8:
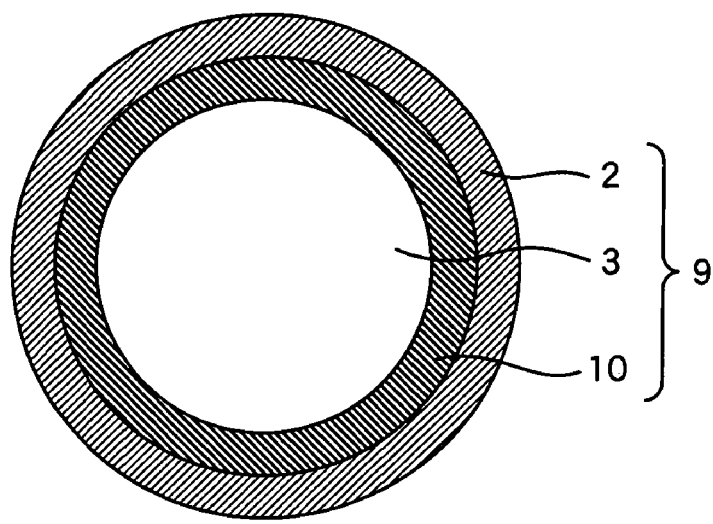
FIG. 8 is a cross sectional view for the $MgB_2$ superconducting wire shown in FIG. 6.

FIG. 6 is a cross sectional view showing a superconductive connection structure between a superconducting wire material according to the invention and other superconducting wire material, and FIG. 7 is a cross sectional view taken along line C-C in FIG. 6. FIG. 8 is a cross sectional view of an MgB$_2$ wire used for the trial manufacture in this example. An MgB$_2$ wire 9 has a metal sheath 2 of a highly conductive metal layer, an Nb tube 10 of a superconductive metal layer, and an MgB$_2$ superconductive portion 3, a superconductive portion 5 of other superconducting wire 4 and an Nb tube 10 are fixed to form a wire material fixed portion 6, which are inserted into a connection metal tube 8 filled with a solder 7. In this connection method, the $MgB_2$ superconductive portion 3 is connected by way of the Nb tube 10 to the solder 7 and other superconductive portion 5.

The structure of this example satisfies all the items I to III described above necessary for the superconductive connection of the $MgB_2$ wire 9. This is to be described below.

I. Since the superconductive connection portion is formed of the $MgB_2$ superconductive portion 3, the Nb tube 10, the solder 7, and the super conduction portion 5 of other superconducting wire, the superconductive connection portion is constituted entirely with the superconductor.

II. While also described for the production process, the underlying Nb tube 10 is not oxidized in this process upon removal of the metal sheath 2. Further, the oxide layer is removed as much as possible between the Nb tube 10 and the $MgB_2$ wire 1 during drawing fabrication. That is, the oxide layer at each of the boundaries, that is, between $MgB_2$-Nb tube, between Nb tube and solder, and between solder and superconductive portion of other superconducting wire is reduced almost to a state of 0.

III. It is adopted a superconductive connection structure while covering the $MgB_2$ superconductive portion 3 with the Nb tube 10 as the superconductor. This enables superconductive connection in the structure capable of satisfying the condition I without degrading the superconduction property of the $MgB_2$ wire 9. In the existent superconductive connection, the superconductive portion was exposed directly while intending to obtain conduction property and stability as high as possible for the superconductive connection portion. However, as shown in Comparative Example 2, in the $MgB_2$ wire 9 manufactured by the powder in tube method, the superconduction property of the $MgB_2$ wire is remarkably lowered by directly exposing the $MgB_2$ superconductive portion 3. Then, by constituting the wire material structure of the $MgB_2$ wire 9 with the Nb tube 10 plus metal sheath 2, it is possible to remove only the metal sheath 2 and conduct superconductive connection without exposing the $MgB_2$ superconductive portion 3.

In this example, superconductive connection of the $MgB_2$ wire 1 is enabled by constituting the wire material structure of the $MgB_2$ wire 9 as a triplicate structure of the $MgB_2$ superconductive portion 3, the Nb tube 10, and the metal sheath 2, removing only the metal sheath 2 without oxidation and connecting the superconductive portion 5 of other superconductive portion wire and the Nb tube 10 covering the $MgB_2$ superconductive portion 3 with the solder upon superconductive connection.

As an alternative embodiment for the structure, the Nb tube 10 can be formed of any superconductive metal having a critical temperature of 4.2K or higher such as Nb—Ti alloy, Nb—Ta alloy, Ta, Pb, or V and, with a practical point of view, it is desirably formed, for example, of Nb, Nb alloy, Nb—Ti alloy, Nb—Ta alloy mainly comprising Nb since superconductive metals showing high critical temperature and magnetic field at a melting point higher than the heat treating temperature for $MgB_2$ and having hardness and toughness capable of enduring wire drawing fabrication. For the metal sheath 2, Cu, Al, Ag, Au, Pt or an alloy thereof, and Cu—Ni alloy are prospective and it is possible to form them as two or more layers and, with a practical point of view, Cu is desirable in view of the cooling effect, etc.

The production process is as described below. The $MgB_2$ wire 9 used was a superconducting wire of triplicate structure of an $MgB_2$ superconductive portion covered with a Cu layer-Nb layer in which Cu is applied to the metal sheath 2. A superconductive connection comprising the $MgB_2$ wire 9 and the NbTi wire 4 was manufactured as a trial.

At first, after dipping one end of the $MgB_2$ wire 9 by 50 mm into an Sn bath at 400° C. for 10 min, it was pulled up from the Sn bath. Then, after dipping one end of the NbTi wire material by 50 min into an Sn bath at 400° C. for 30 min, it was pulled up from the Sn bath. At this instance, only the metal sheath 2 of the Cu layer was dissolved and the Nb tube 10 was in a state deposited with Sn without being oxidized substantially in the $MgB_2$ wire 9.

In this case, the length dipped in the Sn bath is preferably about from 5 mm to 500 mm in accordance with the magnitude of current supplied to the $MgB_2$ superconducting wire. The dipping length is equal with the connection length. Usually, while the connection length is determined depending on the value of the current to intend to be conducted, in a case where it is shorter than 5 mm, the amount of the conducted current is decreased abruptly and, on the other hand, in a case where it is longer than 500 mm, it results in enlargement of the size and cost increase of the apparatus, which is not effective.

The dipping condition in the Sn bath is preferably about 250° C. to 650° C.×10 min to 120 min. The condition is determined depending on the Cu ratio of the superconducting wire material, wire material structure, and wire material diameter. Accordingly, while the condition can not be decided generally, since the conduction property of the superconducting wire is lowered by making the temperature higher and the time longer excessively, it is desirably within the range of the condition described above.

Similar superconductive connection portions can be prepared in the same manner also by an Mg bath, In bath, Ga bath, Pb bath, Te bath, Ti bath, Zn bath, Bi bath, and Al bath in addition to the Sn bath. The superconducting wire is dipped in the bath with an aim of exposing the superconductive portion of the superconductive material with no oxidation. Accordingly, similar effect can also be obtained so long as the metal bath can solid solubilize Cu or Ag forming the outer periphery of the superconducting wires at a melting point as low as possible.

Then, after dipping one end of the $MgB_2$ wire by 60 mm in the Sn bath in a solder (hereinafter referred to as PbBi) bath 7 for 10 min, it was pulled up from the PbBi bath. Then, after dipping one end of the NbTi wire by 60 mm in the Sn bath it was dipped in the PbBi bath at 400° C. for 10 min and then pulled up from the PbBi bath. At this instance, the $MgB_2$ wire was in a state deposited with PbBi for the Nb tube 10 with no oxidation. In this case, the length to be dipped in the PbBi bath is about from 5 mm to 500 mm and it is desirable to dip for a length deeper than the Sn dipping length. This is for improving the wettability of PbBi. Further, the dipping condition in the PbBi bath is desirably about 150° C. to 650° C.×10 min to 60 min. The condition is determined depending on the Cu ratio of the superconducting wire material, the wire material structure and the wire material diameter. Accordingly, although the condition can not be determined generally, since the conduction property of the superconducting wire is lowered when the temperature is increased and the time is made longer excessively, it is desirable to be within the range of the condition described above.

As the PbBi bath, a solder comprising from 30 to 70% of Pb and from 30 to 70% of Bi on the weight basis is preferred. This is because the superconductive performance of PbBi per se is lowered out of the ingredients range described above. Further, since it is dipped into the PbBi bath after dipping in the Sn bath, identical conduction property can be obtained even when the metal used for dipping is mixed by about 5 wt %.

Then, a wire material fixed portion was manufactured by depositing PbBi to the surface of the $MgB_2$ wire with no oxidation and fixing the superconductive portion of NbTi wires with the Cu wire. In this case, by preparing the wire material fixed portion by caulking, spot welding, supersonic welding, diffusion joining to such an extent as not destroying the $MgB_2$ superconducting wire, since the superconductive portions can be brought into contact with each other more closely, the conduction characteristic is improved.

Finally, after inserting the wire material fixed portion into the connection metal tube 8 made of Cu, PbBi was filled therein. In this case, for the connection metal tube 8, those excellent in cooling performance such as Cu, Al, Ag or Au, or those having superconductivity such as Nb or Ta, and Nb—Ti alloy, Nb—Ta alloy, etc. can be used, and identical superconductive connection portion can be manufactured by any of them. The purpose of the connection metal tube 8 is to held PbBi in the tube and make it compatible with the wire material fixed portion.

Figure 9:
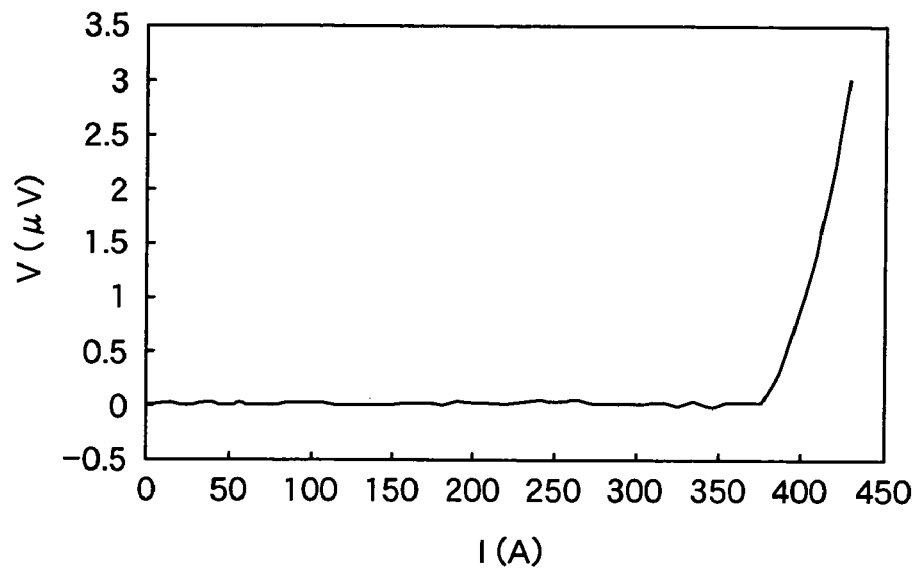
FIG. 9 is a graph showing a relation between voltage and current for evaluating a critical current of a superconductive connection structure according to the invention.

FIG. 9 is a graph showing the result of evaluating the critical current of the manufactured superconductive connection sample. Measurement was conducted by dipping the entire specimen into liquid helium by using a usual DC current four-terminal method. In a case of the superconductive connection sample in this example, generation of resistance was not observed in the current conduction up to 380 A. While the present performance is: Ic=380 A, higher critical current can be expected further by making Jc of the $MgB_2$ wire higher, appropriately increasing the connection length, and reducing the oxidative factor for the connection portion.

Figure 10:
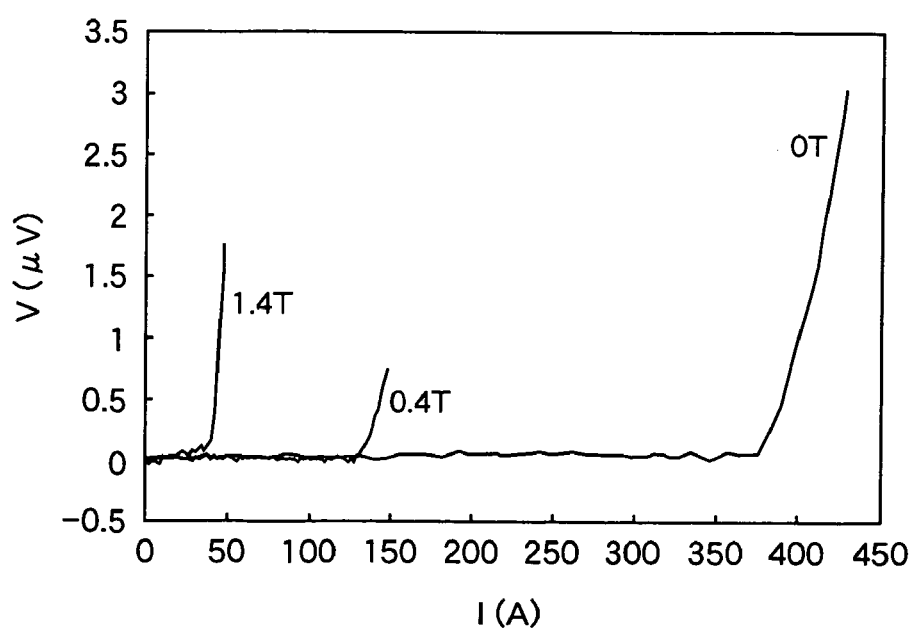
FIG. 10 is a graph showing a relation between voltage and current for evaluating the critical current by applying an external magnetic field to the superconductive connection structure according to the invention.

FIG. 10 is a graph showing the result of measuring the critical current in the same manner by applying an external magnetic field to the superconductive connection portion. It has been fount that the critical current decreased along with increase in the magnetic field, and the connection portion is made superconductive up to about 1.5 T for which the solder was considered effective. Particularly, between 0 T-0.3 T, it had a high critical current of 150 A or more. This is considered to be attributable to that the critical magnetic field of Nb is about 0.4 T. It is considered also from the foregoings that the critical current for the superconductive connection portion is further improved by substituting the Nb tube with a superconductive metal having further higher critical magnetic field such as NbTi.

Figure 11:
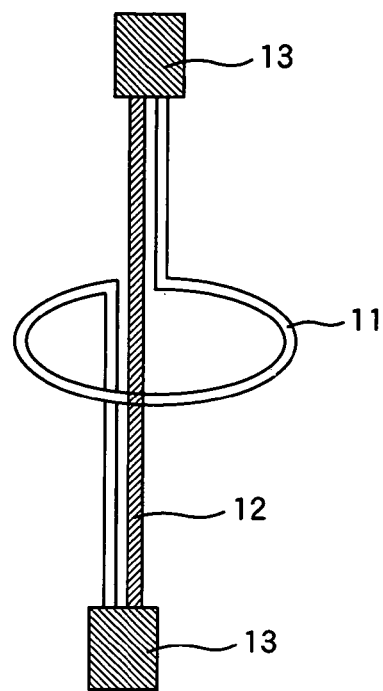
FIG. 11 is a diagrammatic view of a sample used for measuring the connection resistance of a superconductive connection portion of the invention.

FIG. 11 is a constitutional view of a sample for use in the measurement of connection resistance that measures the connection resistance of the superconductive connection portion. The sample comprised one-turn coil 11 comprising an NbTi wire, a short circuit wire 12 comprising an $MgB_2$ wire, and a superconductive connection portion 13 according to this example. After applying a magnetic field necessary for the superconductive connective portion 13, a current was induced from the outside to the one-turn coil 11 and necessary current is supplied thereby conducting permanent current operation and the connection resistance of the superconductive connection portion was evaluated. The evaluation method can estimate the energy loss for the entire circuit by observing the change with time of the magnetic field. In a case where the energy loss in the superconducting wire constituting the circuit is sufficiently small, the entire resistance R of the superconductive connection portion is determined based on the magnetic field attenuation rate B(T)/B(T=0), change with time I, and the inductance value L of the circuit.

Figure 12:
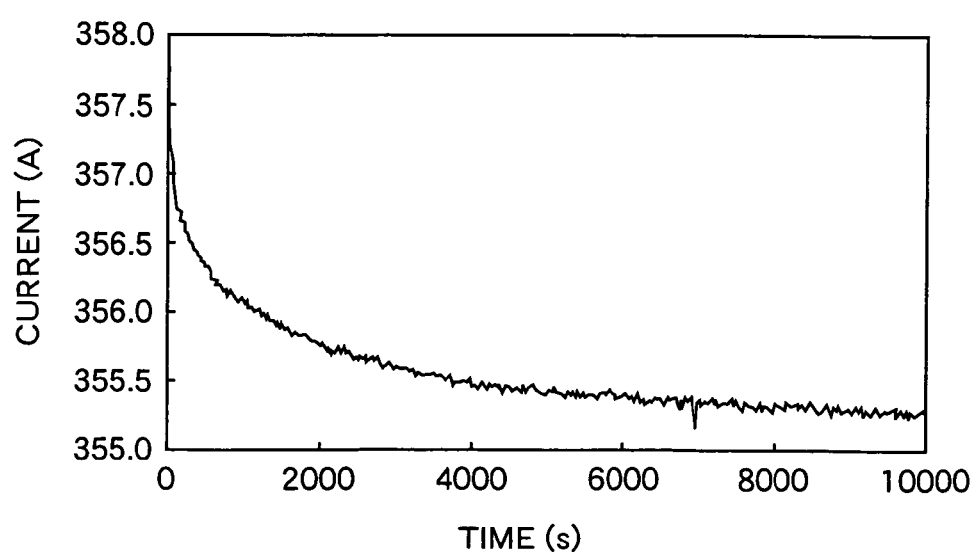
FIG. 12 is a graph showing a relation between current and time evaluating the connection resistance of the superconductive connection portion in the structure shown in FIG. 11.

FIG. 12 is a graph showing the result of evaluating the connection resistance of the superconductive connection portion by the method shown in FIG. 11. As shown in FIG. 12, as a result of applying a current equal to or less than the critical current, it was found that the connection resistance of the superconductive connection was $1 \times 10^{-12}$ Ω or less. Further it was found that the portion had the same connection resistance also upon applying the external magnetic fields from 0 T to 1.4 T.

EXAMPLE 2

In this example, description is to be made for the structure of the $MgB_2$ wire capable of various superconductive connections and the cross sectional connection structure thereof. In this example, in order not to expose the $MgB_2$ superconductive portion, it is necessary for the superconductive connection of the $MgB_2$ wire to cover the same with an alloy having a superconduction characteristic such as Nb or NbTi. In view of the above, after designing and manufacturing an $MgB_2$ wire structure having such characteristics, it was superconductively connected with the NbTi wire in the same manner as described above.

Figure 13:
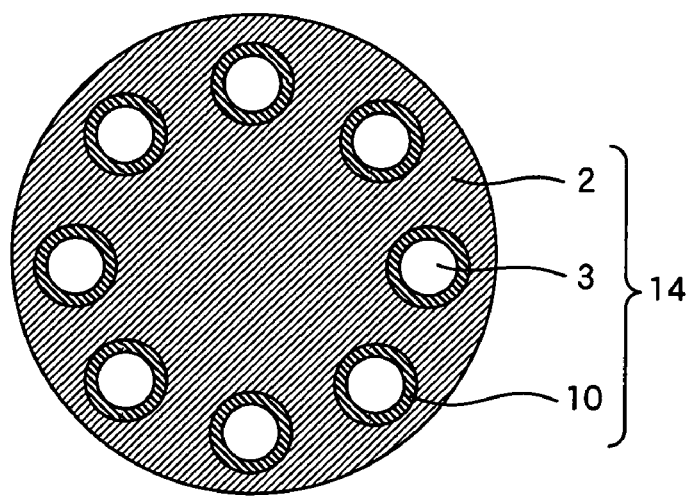
FIG. 13 is a cross sectional view of a composite multi-cored $MgB_2$ superconducting wire according to the invention.

FIG. 13 is a cross sectional view showing an example of a composite multi-core $MgB_2$ wire. A composite multi-core $MgB_2$ wire 14 has a structure in which an $MgB_2$ superconductive portion 3 is surrounded with an Nb tube 10 and a plurality of them are buried in the metal sheath 2. Superconductive connection was conducted by using the $MgB_2$ wire.

Figure 14:
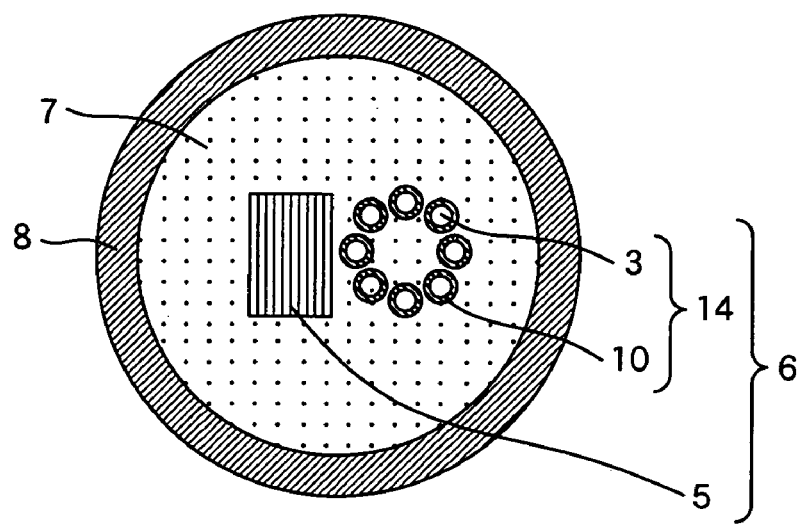
FIG. 14 is a cross sectional view showing a superconductive connection structure using the composite multi-core $MgB_2$ superconducting wire in FIG. 13.

FIG. 14 is a cross sectional view showing a superconductive connection structure using the composite multi-core $MgB_2$ wire shown in FIG. 13. The wire has a structure in which a plurality of Nb tubes 10 each filled with the $MgB_2$ superconductive portion 3 of the composite multi-core $MgB_2$ wire 14, the $MgB_2$ superconductive portion 3, and the superconductive portion 5 of other superconducting wire 4 are fixed to form a wire material fixed portion 6, which is inserted into a connection metal tube 8 filled with a solder 7. Also in this connection structure, in the same manner as in Example 1, the metal sheath 2 is removed at the connection portion, and since the plurality of $MgB_2$ superconductive portions 3 are connected by way of the Nb tubes 10 to the solder 7 and other superconductive portion 5, the wire is entirely constituted with the superconductor. Further, since the $MgB_2$ superconductive portion 3 has a smaller diameter, the density of the $MgB_2$ superconductive portion 3 is increased and, as a result, the critical current density is improved. Further, since this is a structure causing less flux jump, the stability and the characteristic of the superconductive layers per se are improved to also improve the characteristic and the stability of the superconductive connection portion.

EXAMPLE 3

Figure 15:
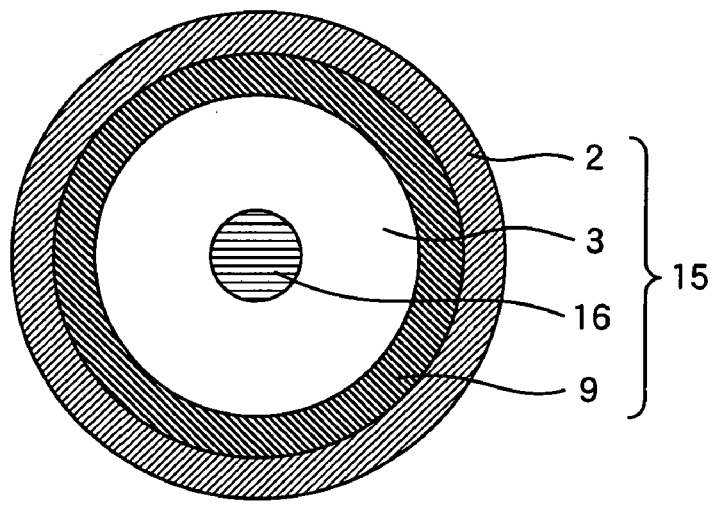
FIG. 15 is a cross sectional view of a high strength $MgB_2$ superconducting wire according to the invention.

FIG. 15 is a cross sectional view showing an example of a high strength $MgB_2$ wire according to the invention. A high strength $MgB_2$ wire 15 has a structure in which a high strength metal 16 and an $MgB_2$ superconductive portion 3 are surrounded with an Nb tube 10 and they are arranged in a metal sheath 2. Superconductive connection was conducted by using the $MgB_2$ wire.

Figure 16:
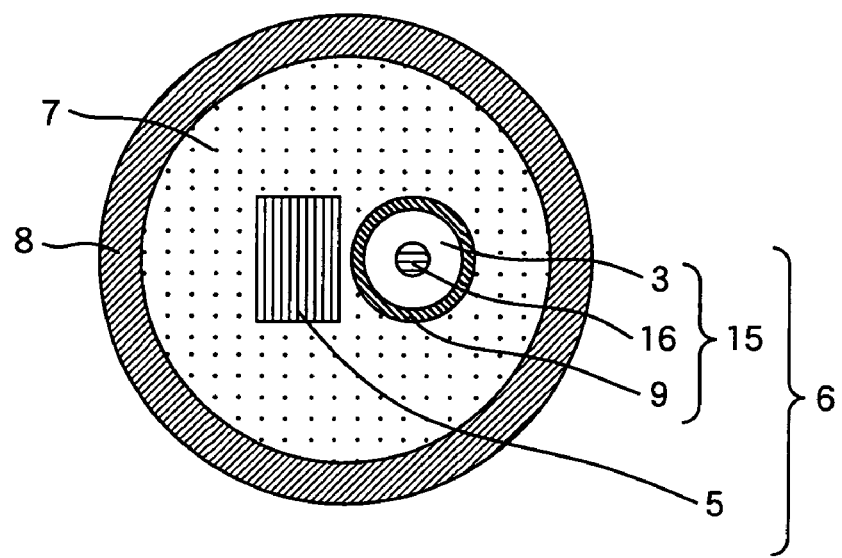
FIG. 16 is a cross sectional view showing a superconductive connection structure using the high strength $MgB_2$ superconducting wire shown in FIG. 15.

FIG. 16 is a cross sectional view showing a superconductive connection structure using the composite multi-core $MgB_2$ wire shown in FIG. 15. An Nb tube 10 filled with $MgB_2$ superconductive portion 3, the $MgB_2$ superconductive portion 3 of the high strength $MgB_2$ wire 15, and a superconductive portion 5 of other superconducting wire 4 are fixed to form a wire material fixed portion 6, which is inserted into a connection metal tube 8 filled with the solder 7. Also in the connection mechanism, in the same manner as described previously, the metal sheath 2 is removed from the connection portion, and since the $MgB_2$ superconductive portion 3 is connected by way of the Nb tube 10 with the solder 7 and other superconductive portion 5, the wire is entirely constituted with the superconductors. Further, since the strength of the $MgB_2$ wire per se is increased, the entire superconductive connection portion is also increased in the strength. Further, the stability and the characteristic of the superconducting wire per se are improved and, accordingly, the characteristic and the stability of the superconductive connection portion are also improved.

EXAMPLE 4

Figure 17:
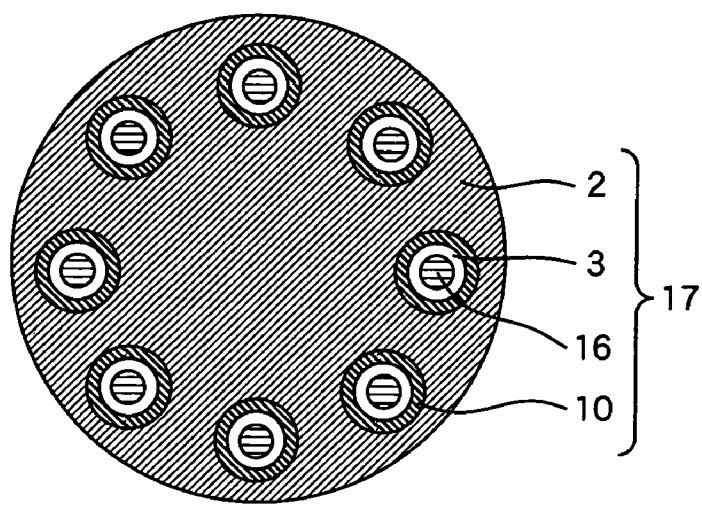
FIG. 17 is a cross sectional view of a composite multi-core $MgB_2$ superconducting wire according to the invention.

FIG. 17 is a cross sectional view showing an example of a composite multi-core $MgB_2$ wire according to the invention. A composite multi-core $MgB_2$ wire 17 has a structure in which a high strength metal 16, and an $MgB_2$ superconductive portion 3 are surrounded with an Nb tube 10, and they are arranged in plurality in a metal sheath 2. Superconductive connection was conducted by using the $MgB_2$ wire.

Figure 18:
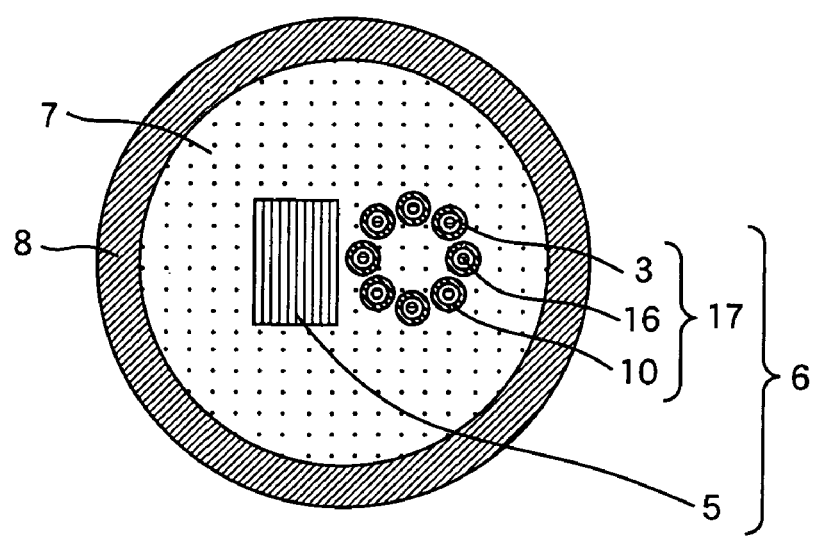
FIG. 18 is a cross sectional view showing a superconductive connection structure using the composite multi-core $MgB_2$ superconducting wire shown in FIG. 17.

FIG. 18 is a cross sectional view showing a superconductive connection structure using the composite multi-core $MgB_2$ wire in FIG. 17. A plurality of the Nb tubes each filled with the $MgB_2$ superconductive portion 3 of the composite multi-core $MgB_2$ wire 17 and the $MgB_2$ superconductive portion 3, and the superconductive portion 5 of other superconducting wire 4 are fixed to form a wire material fixed portion 6, which is inserted into the connection metal tube 8 filled with the solder 7. Also in the connection structure, in the same manner as described above, the metal sheath 2 is removed from the connection portion and, since a plurality of the $MgB_2$ superconductive portions 3 are connected by way of the Nb tube 10, with the solder 7 and other superconductive portion 5, the entire portion is constituted with the superconductive conductor. Further, since the diameter of the $MgB_2$ superconductive portion is smaller, the density of the $MgB_2$ superconductive portion is increased and, as a result, the critical current density is improved. Further, since this is a structure causing less flux jump, the stability and the characteristic of the superconducting wire per se are improved. Further, the strength of the $MgB_2$ superconducting wire per se is increased. Accordingly, the stability and the characteristic of the superconducting wire are also improved. Further, for the high strength metal 16, those metals which are non-magnetic and excellent in the toughness typically represented by Ta, Nb, Nb—Ta alloy, Nb—Ti alloy are applicable.

EXAMPLE 5

Figure 19:
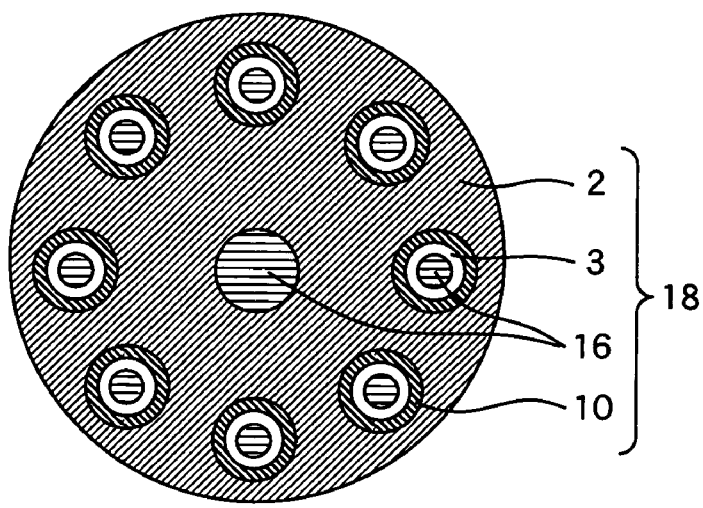
FIG. 19 is a cross sectional view of a composite multi-core $MgB_2$ superconducting wire according to the invention.

FIG. 19 is a cross sectional view showing an example of a composite multi-core $MgB_2$ wire. A composite multi-core $MgB_2$ wire 18 has a structure in which a high strength metal 16 and an $MgB_2$ superconductive portion 3 are surrounded by an Nb tube 10, they are arranged by plurality in a metal sheath 2 with the high strength metal 16 being disposed at a central portion. A superconductive connection was conducted by using the $MgB_2$ wire.

Figure 20:
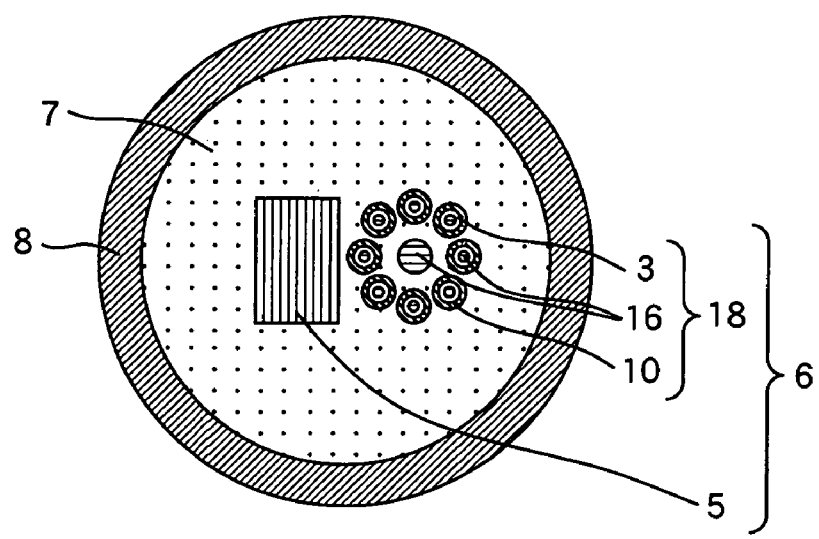
FIG. 20 is a cross sectional view showing a superconductive connection structure using the composite multi-core $MgB_2$ superconducting wire shown in FIG. 19.

FIG. 20 is a cross sectional view showing a superconductive connection structure using the composite multi-core $MgB_2$ wire in FIG. 19. This has a structure in which a plurality of Nb tubes 10 filled with $MgB_2$ superconductive portions 3 of the composite multi-core $MgB_2$ and the superconductive portion 5 of other superconducting wire 4 are fixed to form a wire material fixed portion 6, which is inserted into a connection metal tube 8 filled with a solder 7. Also in this connection structure like in the constitution as described above, the metal sheath 2 is removed at the connection portion and, since a plurality of $MgB_2$ superconductive portions 3 are connected by way of the Nb tube 10 with the solder 7 and other superconductive portion 5, all the components are constituted with the superconductor. Further, since the diameter of the $MgB_2$ superconductive portion 3 is smaller, the density of the $MgB_2$ superconductive portion 3 is increased and, as a result, the critical current density is improved. Further, since the structure causes less flux jump, the stability and the characteristic of the superconducting wire per se are improved and the strength of the $MgB_2$ superconducting wire per se is increased. Accordingly, the characteristic and the stability of the superconductive connection portion are also improved.

EXAMPLE 6

Figure 21:
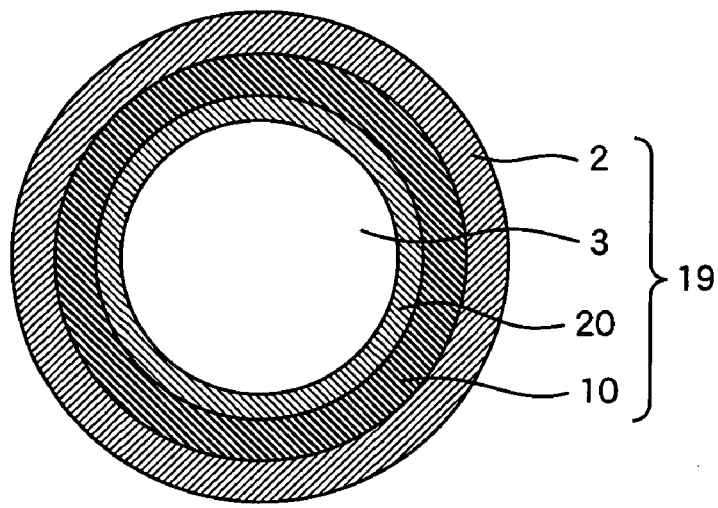
FIG. 21 is a cross sectional view of a composite multi-core $MgB_2$ superconducting wire according to the invention.

FIG. 21 is a cross sectional view showing an example of a composite $MgB_2$ wire. A composite multi-core $MgB_2$ wire 19 has a structure in which an $MgB_2$ superconductive portion 3 is surrounded with an Nb tube 10 and a superconductive sheath 20 and they are arranged in a metal sheath 2. Superconductive connection was conducted by using the $MgB_2$ wire.

Figure 22:
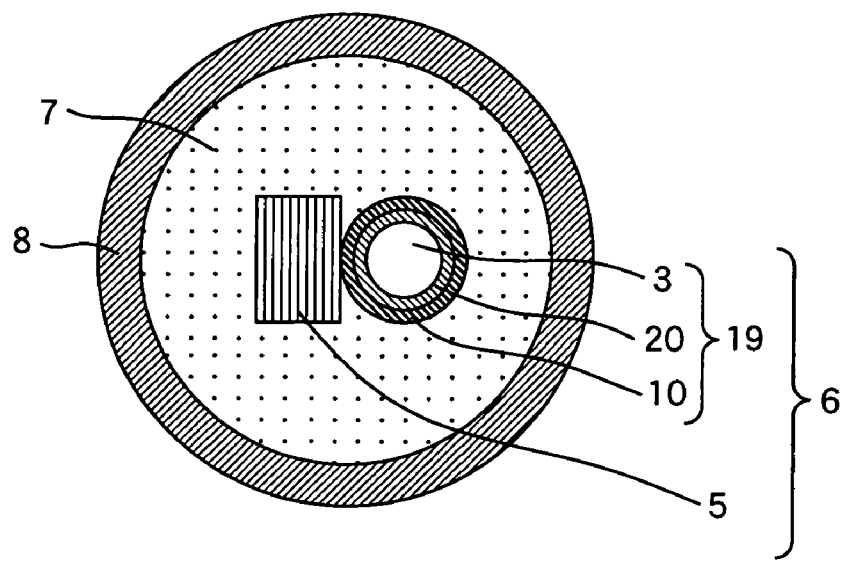
FIG. 22 is a cross sectional view showing a superconductive connection structure using the composite multi-core $MgB_2$ superconducting wire shown in FIG. 21.

FIG. 22 is a cross sectional view showing a superconductive connection structure using the composite multi-core $MgB_2$ wire in FIG. 21. This has a structure in which an Nb tube 10 filled with the $MgB_2$ superconductive portion 3 of the composite $MgB_2$ wire 19, the superconductive sheath 20 and the superconductive portion 5 of other superconducting wire 4 are fixed to form a wire fixed portion 6, which is inserted into a connection metal tube 8 filled with a solder 7. Also in this connection structure, like in the structure described above, the metal sheath 2 is removed at the connection portion and since the $MgB_2$ superconductive portion 3 is connected with by way of the Nb tube 10 and the superconductive sheath 20 with the solder 7 and other superconductive portion 5, all the components are constituted with the superconductor. Accordingly, the stability and the characteristic of the superconducting wire per se are improved and the strength of the $MgB_2$ superconducting wire per se is increased.

In this example, superconductive connection is also possible, in a case where the sequence of the Nb tube and the superconductive sheath are reversed or, further, in a case where the superconductive sheath is doubled or triplicated. That is, this is a structure in which the $MgB_2$ superconductive portion is covered with the superconductive sheath and, also in a case where this is formed as a multiple structure, superconductive connection is possible in the same manner. Further, in a case of being applied to the multi-core structure, high strength structure shown in FIG. 13 to FIG. 20, the superconductive connection is possible in the same manner.

EXAMPLE 7

In this example, superconductive connection was manufactured in the same manner as described above for $MgB_2$ wire and $Nb_3Sn$ wire, $MgB_2$ wire and $MgB_2$ wire, and $MgB_2$ wire and $Nb_3Al$ wire instead of the superconductive connection between the $MgB_2$ wire and NbTi wire, and they were evaluated. Also in a case where the superconducting wire to be connected changed from the NbTi wire to the $Nb_3Sn$ wire or $Nb_3Al$ wire, the same superconduction characteristic can be obtained by dissolving Cu in $Nb_3Sn$ and $Nb_3Al$ without oxidation, exposing the superconductive portion and superconductively connecting the same with the $MgB_2$ wire by the method described above. Further, also in a case of connecting the $MgB_2$ wires to each other, the same superconduction characteristic can be obtained by adopting the cross sectional structure of the $MgB_2$ wire described above and conducting superconductive connection by the same structure as described above. Further, identical superconduction characteristic can be obtained also in (NbTi)$_3$Sn and other Nb-based superconducting wires.

Further, also in an oxide superconductor favorable superconduction characteristic although somewhat lower than that described above can be obtained by conducting superconductive connection in the same structure. However, by forming the structure of the oxide superconductor to a structure suitable to superconductive connection, identical performance can be obtained.

EXAMPLE 8

Figure 23:
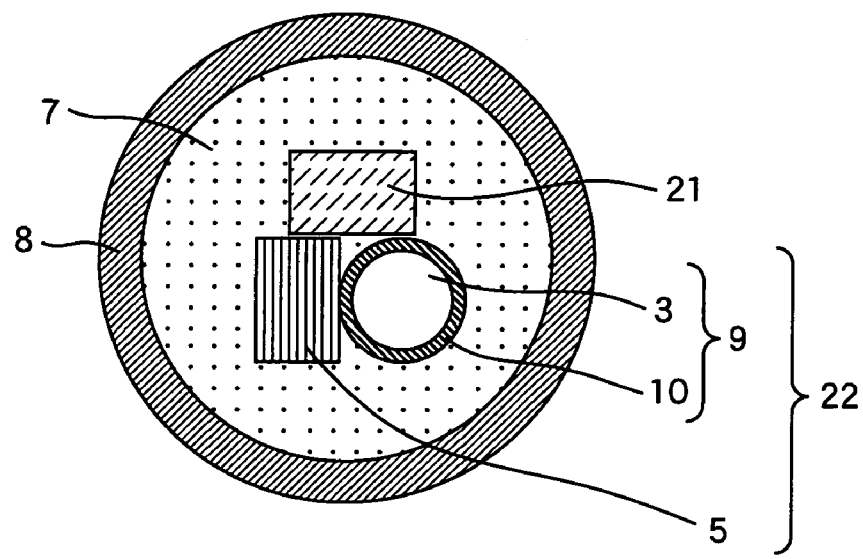
FIG. 23 is a cross sectional view showing a superconductive connection structure in which three superconducting wires including the $MgB_2$ superconducting wire according to the invention are superconductively connected.

FIG. 23 is a cross sectional view showing a superconductive connection structure in which three superconducting wires including the MgB$_2$ wire are superconductively connected. An Nb tube 10 filled with an MgB$_2$ superconductive portion 3 of an MgB$_2$ wire 9, a superconductive portion 5 of another superconducting wire and, further, a superconductive portion 21 of a further superconducting wire are fixed to form a plurality of fixed portions 22, which are inserted into a connection metal tube 8 filled with a solder 7. Also in this connection structure, in the same manner as described above, the metal sheath 2 is removed at the connection portion and, since the MgB$_2$ superconductive portion 3 is connected by way of the Nb tube 10 with the solder 7, the superconductive portion 21 and the superconductive portion 5, they are entirely constituted with the superconductor. Further, in a case where the number of connections is increased as 4, 5, - - -, a superconductive connection portion having the same property as that in the case of using two connections can be manufactured by applying the MgB$_2$ wire in the same manner and exposing the conductive portion without oxidizing other superconducting wires in the same manner and constituting all the connection portions with the superconductor, to obtain the same superconduction characteristic as that described previously.

EXAMPLE 9

Figure 24:
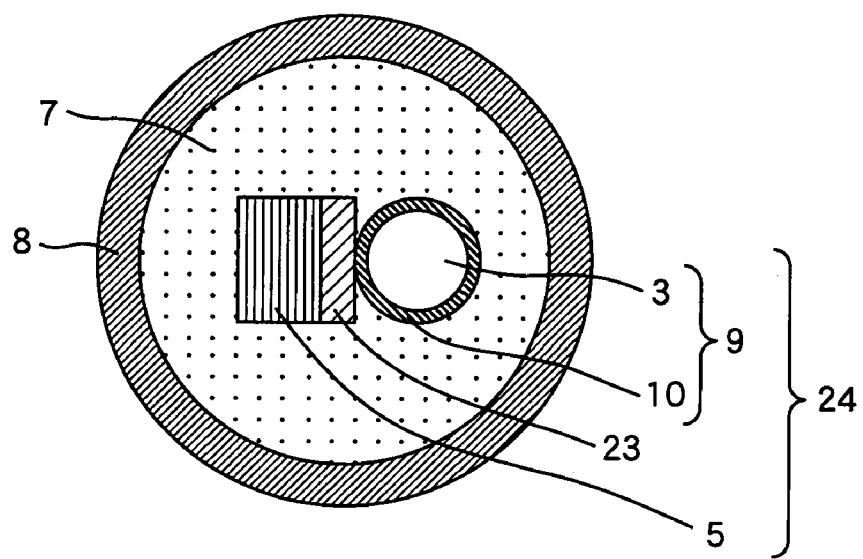
FIG. 24 is a cross sectional view showing a superconductive connection structure in which the another superconductor is interposed between the $MgB_2$ superconducting wire according to the invention and the another superconducting wire.

FIG. 24 is a cross sectional view showing other superconductive connection structure in which a superconductive portion of other superconducting wire or a superconductor made of a superconductive metal is disposed between an MgB$_2$ wire and another superconducting wire. This has a structure in which an Nb tube 10 filled with an MgB$_2$ superconductive portion 3 of an MgB$_2$ wire 9, another superconductor 23, and the superconductive portion 5 of other superconducting wire are successively connected and fixed to form a connection fixed portion 24, which is inserted into a connection metal tube 8 filled with a solder 7. Also in this connection structure, in the same manner as described above, the metal sheath 2 is removed at the connection portion and, since the MgB$_2$ superconductive portion 3 is connected by way of the Nb tube 10 with the superconductor 23, the solder 7 and the superconductor of other superconductive portion 5 and all the connection portions are made superconductive, the same superconduction characteristic as that described above can be obtained.

EXAMPLE 10

In this example, in the same manner as the MgB$_2$ wire, an NbTi wire, Nb$_3$Sn wire, or Nb$_3$Al wire having the superconductive coating layer and the highly conductive metal layer as described in Examples 1 to 9 is manufactured by a powder-in tube method and the highly conductive metal layer is removed at the connection portion in the same manner, and superconductive connection can be obtained. Accordingly, since all the connection portions are rendered superconductive, the same superconduction characteristic as described above can be obtained also for the connection with each of the NbTi wire, Nb$_3$Sn wire, or Nb$_3$Al wire, and connection with other superconducting wire. This is not restricted to the three types as described above but the same effect can also be obtained so long as it is the superconducting wire of a structure which is manufactured by the powder-in tube method and where the superconductive portion is covered with Nb or Nb alloy.

EXAMPLE 11

Since the MgB$_2$ wire has a critical temperature of 39K which is higher by 20K than that of other metal type superconductive materials, the upper critical magnetic field is also higher than that of other metal-based superconductive materials, a thin film superconductor has a critical magnetic field of 40 T, and the magnetic anisotropy is extremely small, a high critical current density can be obtained without aligning the crystallographic direction with that of the substrate as in the case of copper type oxides, and even when strain at 1.5% is applied, a critical current density of 90% or more can be maintained relative to the wire material with no strain. By utilizing the features described above, application for refrigerator cooling and in intense magnetic fields can be expected.

One of the application used in the intense magnetic fields includes NMR (Nuclear Magnetic Resonance Spectrometer) or MRI (Magnetic Resonance Imaging) apparatus. Such apparatus require a magnet system capable of generating and controlling static magnetic fields at an extremely high level and, for attaining the same, a superconductive magnet capable of permanent current operation in which superconductive coils of multiple layers are superconductively connected is indispensable. The permanent current operation means an operation method of restricting the fluctuation of current values thereby capable of obtaining magnetic fields with extremely less fluctuation with time by short-circuiting both ends of superconductive coils and keeping current to flow through a closed loop circuit prepared by a superconductor.

For attaining the permanent current operation, a permanent current switch (PCS) is necessary, and a closed loop circuit comprising a superconductor has to be formed in which both ends of wire material forming superconductive coils and both ends of superconducting wires constituting PCS are connected. Accordingly, such NMR or MRI can be attained actually by applying the connection method in the examples described above to the superconductive connection technique.

Further, for the MgB$_2$ wire, the powder-in tube method is used and it includes an ex-situ method of directly incorporating MgB$_2$ in a single-walled metal sheath tube such as made of Fe, SUS, Cu, Ni, etc. or a metal sheath tube formed by compositing them and preparing an MgB$_2$ superconducting wire by applying drawing fabrication at an extremely high working rate, and an in-situ method of incorporating Mg and B and applying a heat treatment after drawing fabrication to form MgB$_2$.

From the foregoings, the MgB$_2$ wire is applicable, for example, to the development of apparatus requiring permanent current operation including NMR or MRI by superconductively connecting the MgB$_2$ wire with an identical or different kind of a superconducting wire. Further quenchless superconductive coils can be manufactured by applying the MgB$_2$ wire and utilizing higher critical temperature and critical magnetic field thereof than in a case of applying the existent metal based superconducting wires, thereby improving the performance of the superconductive magnet per se. Further, since the MgB$_2$ wire generally has higher n value, the characteristic of the entire superconductive magnet is improved by applying to PCS.

Specifically, this is applicable as superconducting wires for equipment such as current leads, power distribution cables, large-scale magnets, nuclear magnetic resonance spectrometer, medical magnetic resonance imager, superconductive power storage apparatus, magnetic separation apparatus, single crystal pull-up device in magnetic fields, superconductive magnet apparatus for the refrigerator cooling, superconductive energy storage, superconductive electric generators and magnets for use in thermonuclear fusion reactors.

What is claimed is:

1. A connection structure of a magnesium diboride superconducting wire in which a magnesium diboride superconducting wire covered with a superconductive coating layer and another superconducting wire are connected in a connecting metal tube filled with a solder, wherein the magnesium diboride superconducting wire and the another superconducting wire are in contact with each other by way of the superconductive coating layer.

2. A connection structure of a magnesium diboride superconducting wire according to claim 1, wherein the superconductive coating layer comprises one of Nb, an Nb alloy, Nb—Ti alloy and Nb—Ta alloy mainly comprising Nb.

3. A connection structure of a magnesium diboride superconducting wire according to claim 1, wherein the another superconducting wire comprises a superconducting wire of one of MgB$_2$, NbTi, Nb$_3$Sn and Nb$_3$Al.

4. A connection structure of a magnesium diboride superconducting wire according to claim 1, wherein the superconductive coating layer is covered with a highly conductive metal layer other than the connection portion.

5. A connection structure of a magnesium diboride superconducting wire according to claim 4, wherein the highly conductive metal layer is a member selected from the group consisting of Cu, Al, Ag, Au, Pt, alloys thereof and a Cu—Ni alloy.

6. A connection structure of a magnesium diboride superconducting wire according to claim 4, wherein the highly conductive metal layer is removed from the connection portion before the connection by dipping into a molten bath of Sn, Mg, In, Ga, Pb, Te, Tl, Zn, Bi or Al.

7. A connection structure of a magnesium diboride superconducting wire according to claim 1, wherein the solder contains 30 to 70% of Pb and 30 to 70% of Bi on the weight basis.

8. A connection structure of a magnesium diboride superconducting wire according to claim 1, wherein the magnesium diboride superconducting wire comprises a plurality of the magnesium diboride superconducting wires.

9. A connection structure of a magnesium diboride superconducting wire according to claim 1, wherein a high strength metal wire is disposed in the axial direction at the central portion of the magnesium diboride superconducting wire.

10. A connection structure of a magnesium diboride superconducting wire according to claim 9, wherein the high strength metal wire is one of Ta, Fe and Nb.

11. A connection structure of a magnesium diboride superconducting wire according to claim 1, wherein the another superconducting wire comprises a superconducting wire comprising a material other than magnesium diboride.

12. A connection structure of a magnesium diboride superconducting wire according to claim 11, wherein the another superconducting wire comprises a superconducting wire of one of NbTi, Nb$_3$Sn and Nb$_3$Al.

13. A connection structure of a magnesium diboride superconducting wire according to claim 12, wherein the superconductive coating layer is a superconductive material other than magnesium diboride.

14. A connection structure of a magnesium diboride superconducting wire according to claim 12, wherein the superconductive coating layer comprises one of Nb, an Nb alloy, Nb—Ti alloy and Nb—Ta alloy mainly comprising Nb.

15. A connection structure of a magnesium diboride superconducting wire according to claim 11, wherein the superconductive coating layer comprises one of Nb, an Nb alloy, Nb—Ti alloy and Nb—Ta alloy mainly comprising Nb.

16. A connection structure of a magnesium diboride superconducting wire according to claim 11, wherein the superconductive coating layer is a superconductive material other than magnesium diboride.

17. A connection structure of a magnesium diboride superconducting wire according to claim 16, wherein the superconductive coating layer is covered with a highly conductive metal layer other than the connection portion.

18. A connection structure of a magnesium diboride superconducting wire according to claim 17, wherein the superconductive coating layer is exposed at the connection portion without formation of an oxide layer thereon.

19. A connection structure of a magnesium diboride superconducting wire according to claim 18, wherein the magnesium diboride of the magnesium diboride superconducting wire is not exposed.

20. A connection structure of a magnesium diboride superconducting wire according to claim 16, wherein the magnesium diboride of the magnesium diboride superconducting wire is not exposed.

* * * * *